United States Patent
Hsu

(10) Patent No.: US 8,395,175 B2
(45) Date of Patent: Mar. 12, 2013

(54) LIGHT-EMITTING SEMICONDUCTOR DEVICE AND PACKAGE THEREOF

(75) Inventor: Chia-Liang Hsu, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 13/569,612

(22) Filed: Aug. 8, 2012

(65) Prior Publication Data

US 2012/0299043 A1 Nov. 29, 2012

Related U.S. Application Data

(63) Continuation of application No. 12/550,089, filed on Aug. 28, 2009, now Pat. No. 8,242,526.

(30) Foreign Application Priority Data

Aug. 29, 2008 (TW) .............................. 97133520 A

(51) Int. Cl.
*H01L 33/00* (2010.01)
(52) U.S. Cl. .................................. 257/98; 257/E33.067
(58) Field of Classification Search .................... 257/98, 257/E33.06, E33.061, E33.067, E33.068
See application file for complete search history.

(56) References Cited

U.S. PATENT DOCUMENTS

| 7,196,354 B1 | 3/2007 | Erchak et al. |
| 7,812,360 B2 | 10/2010 | Yano |
| 2009/0014744 A1 | 1/2009 | Hsieh et al. |
| 2011/0001157 A1* | 1/2011 | McKenzie et al. .............. 257/98 |

FOREIGN PATENT DOCUMENTS

| CN | 1218996 | 6/1999 |
| JP | 200743074 | 2/2007 |
| TW | 200643340 | 12/2006 |
| TW | 200746473 | 12/2007 |
| TW | 200802938 | 1/2008 |

* cited by examiner

*Primary Examiner* — Zandra Smith
*Assistant Examiner* — Paul Patton
(74) *Attorney, Agent, or Firm* — Muncy, Geissler, Olds & Lowe, PLLC

(57) ABSTRACT

The present application discloses a light-emitting semiconductor device including a transparent layer having an upper surface, a lower surface, and a sidewall; a wavelength conversion structure arranged on the upper surface; an epitaxial structure arranged on the lower surface and having a side surface devoid of the transparent layer and the wavelength conversion structure; and a reflective wall arranged to cover the sidewall.

20 Claims, 10 Drawing Sheets

LIGHT-EMITTING SEMICONDUCTOR DEVICE AND PACKAGE THEREOF

CROSS REFERENCE TO RELATED APPLICATIONS

This application is a continuation application of U.S. patent application Ser. No. 12/550,089, entitled "A Light-emitting semiconductor device and package thereof", filed on Aug. 28, 2009, now U.S. Pat. No. 8,242,526 and the content of which is hereby incorporated by reference.

TECHNICAL FIELD

The present application relates to a light-emitting semiconductor device and package structure, and more particularly to a light-emitting semiconductor device and package thereof with a wavelength conversion structure and a transparent paste layer.

BACKGROUND

Light-emitting diode is a semiconductor solid state device, including at least one p-n junction which is sandwiched between a p-type semiconductor layer and an n-type semiconductor layer. When a bias voltage is applied on the p-n junction, the holes from the p-type semiconductor layer and the electrons from the n-type semiconductor layer are combined to generate light. The region for generating light are generally called the active region.

The major characteristics of the light-emitting diodes are small size, high luminous efficiency, long life-time, quick response, high reliability, and good color rendering index. It has wide application, for example: in electronic equipment, automobile, signboard, or traffic lighting. Because the full-colors LEDs are presented to the public, LED has been replacing gradually the fluorescence lamp and the incandescent bulb along with other traditional illumination equipments.

Generally, the light-emitting diode collocates with the material of the wavelength conversion (example: phosphor) to generate the white light. The material of the wavelength conversion can excite the yellow light, green light, or red light when it is irradiated by the blue light emitted from the LED chip, and the blue light and the yellow light, or green light and red light are mixed to generate the white light. To assure the light generated from the LED chip can pass through the material of the wavelength conversion and mix to generate the light that desired, the material of the wavelength conversion has to cover the light emitting region from the LED chip completely. However, the light emitting direction is not specific, if the material of the wavelength conversion does not cover where the light emits from the LED chip completely and results in that partial light does not pass through the material of the wavelength conversion, such as the edge light, the wavelength conversion efficiency of the light is decreased. On the other hand, if the material of the wavelength conversion covers the LED chip completely, the wavelength conversion efficiency is enhanced, but it causes the heat dissipation problem.

It is not easy to spread the material of the wavelength conversion uniformly on the LED chip. When the thickness of the material of the wavelength conversion that covers the LED chip is not uniform, the thicker portion of the material of the wavelength conversion absorbs more light than the thinner portion of material of the wavelength conversion. The excited light is then different when the lights emitted to different directions facing different thickness of the material of the wavelength conversion.

SUMMARY

An embodiment of the present application provides a semiconductor luminescence device including a transparent layer having an upper surface, a lower surface, and a sidewall; a wavelength conversion structure arranged on the upper surface; an epitaxial structure arranged on the lower surface and having a side surface devoid of the transparent layer and the wavelength conversion structure; and a reflective wall arranged to cover the sidewall.

Another embodiment of the present application provides a semiconductor luminescence device including a wavelength conversion structure having a side surface; an epitaxial structure under the wavelength conversion structure, and having a bottom surface and a top surface with a corner substantially devoid of the wavelength conversion structure; and a first electrode arranged in the corner and having adjacent side surfaces devoid of the wavelength conversion structure.

A further embodiment of the present application provides a semiconductor luminescence device including a wavelength conversion structure having a top area; a space having a reflective boundary, and a first cross section that is substantially parallel to the wavelength conversion structure and has a first area greater than the top area; and a semiconductor luminescence device arranged in the space to be distant from the top area and close to the first cross section.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
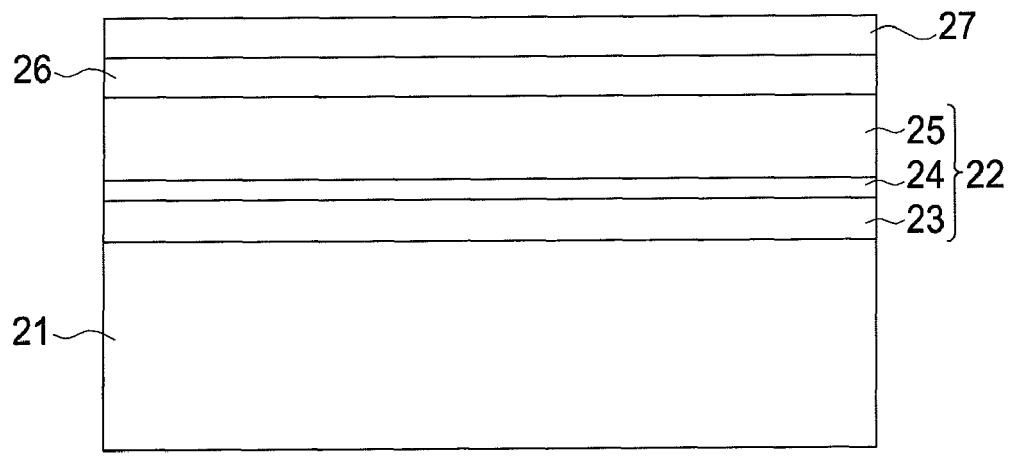
FIGS. 1-5 illustrate the sectional views of forming a semiconductor luminescence device 100 in accordance with one embodiment of the present application.
Figure 3:
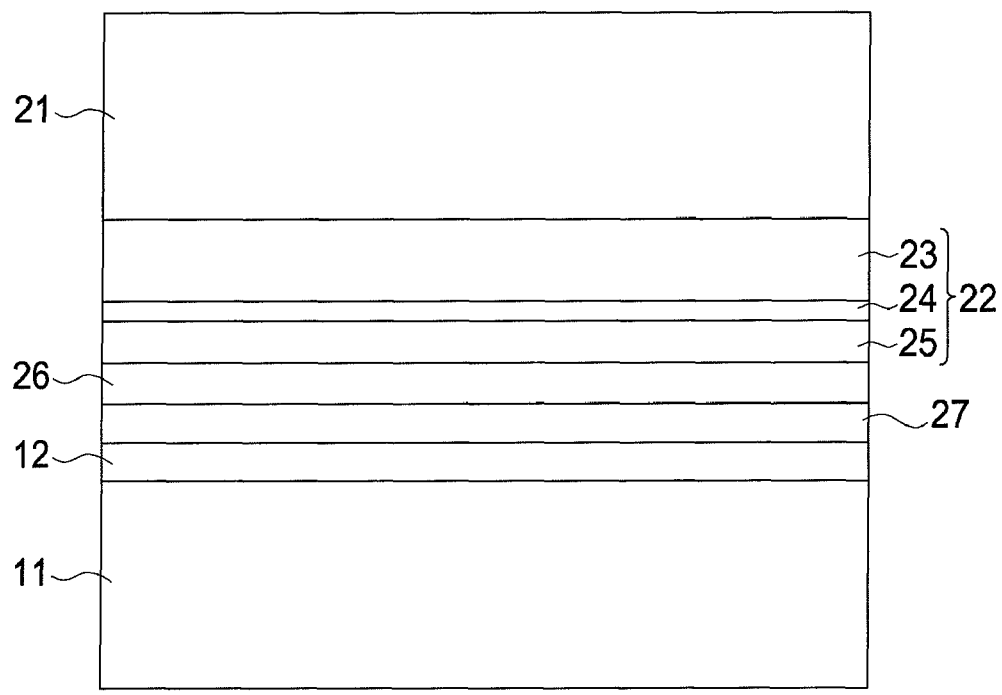
Figure 4:
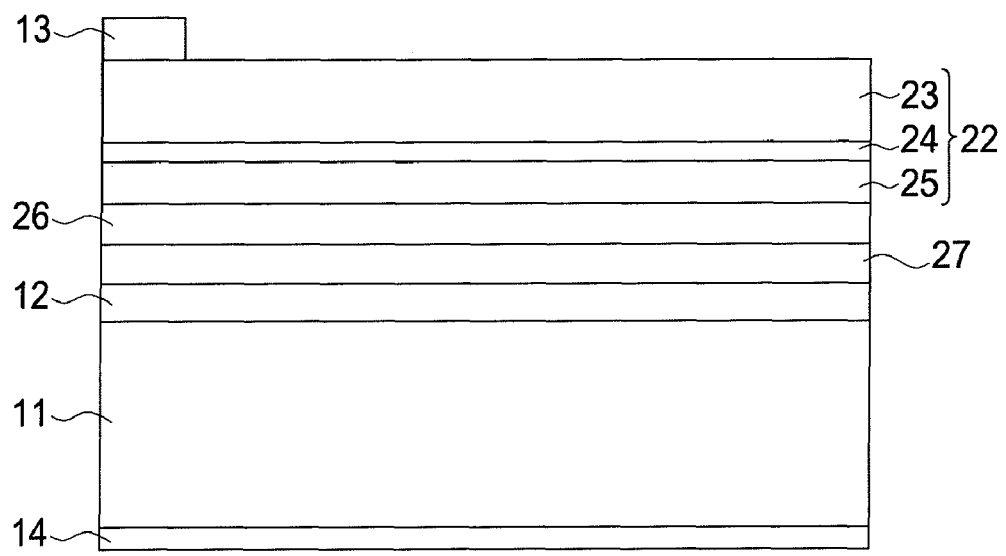
Figure 5:
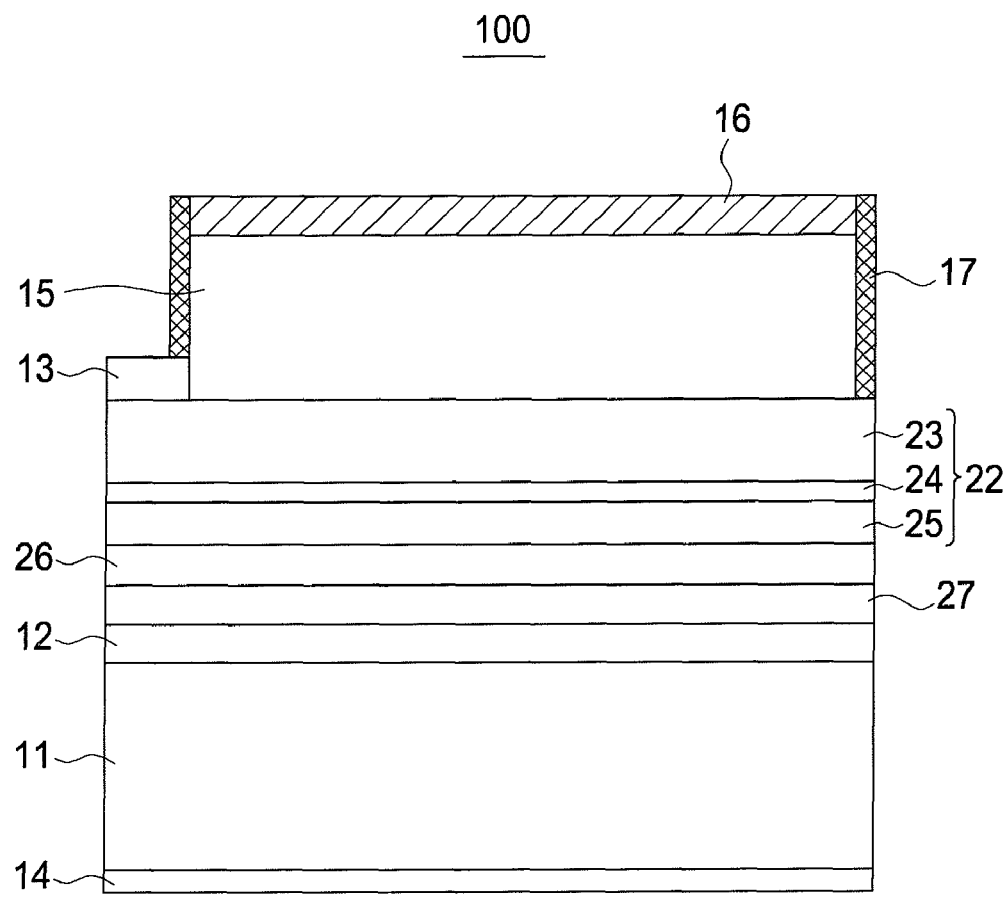

FIG. 5 illustrates the sectional view of a semiconductor luminescence device 100, and the manufacturing process is illustrated in FIG. 1 to FIG. 5. Referring to FIG. 1, a light-emitting diode for example includes a growth substrate 21, and the material of the growth substrate can be GaAs, Si, SiC, Sapphire, InP, GaIn, AlN, or GaN. Then, forming an epitaxial structure 22 on the growth substrate 21. The epitaxial structure 22 is formed by epitaxy process like MOCVD, LPE, or MBE. The epitaxial structures 22 includes at least a first conductivity type semiconductor layer 23, and the material of the first conductivity type semiconductor layer can be an n-type $(Al_xGa_{1-x})_yIn_{1-y}P$ or an n-type $(Al_xGa_{1-x})_yIn_{1-y}N$; an active layer 24, and the material of the active layer can be $(Al_xGa_{1-x})_yIn_{1-y}P$ or $(Al_xGa_{1-x})_yIn_{1-y}N$ to form a multiple quantum well structure; and a second conductivity type semiconductor layer 25, and the material of the second conductivity type semiconductor layer can be a p-type $(Al_xGa_{1-x})_yIn_{1-y}P$ or a p-type $(Al_xGa_{1-x})_yIn_{1-y}N$. In addition, the active layer in this embodiment can be stacked to form a structure like homostructure, single heterostructure, double heterostructure, or single quantum well.

Then, a second conductivity type contact layer 26 and a reflective layer 27 are formed on the epitaxial structure 22. The material of the second conductivity type contact layer 26 can be indium tin oxide, indium oxide, tin oxide, cadmium tin oxide, zinc oxide, magnesium oxide, or titanium nitride conductive oxide materials. The material of the reflective layer 27 can be metal such as aluminum, gold, platinum, zinc, silver, nickel, germanium, or tin, or can be made of metal and oxide, such as ITO/Ag, ITO/AlO$_x$/Ag, ITO/TiO$_x$/SiO$_x$, TiO$_x$/SiO$_x$/Al, ITO/SiN$_x$/Al, ITO/SiN$_x$/Ag, ITO/SiN$_x$/Al$_2$O$_3$Al, or ITO/SiN$_x$/Al$_2$O$_3$/Ag.

Figure 2:
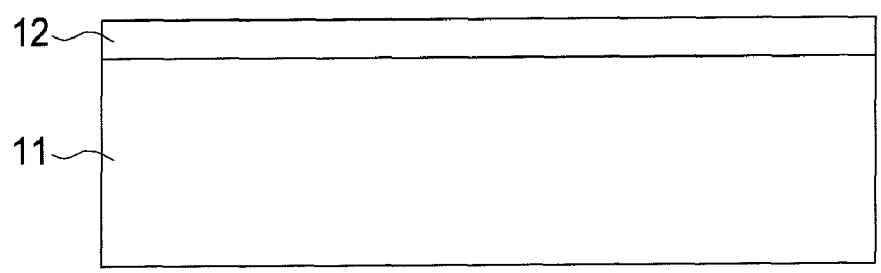

Referring to FIG. 2, a connecting layer 12 is formed on the electrically conductive substrate 11. Next, the epitaxial structure 22 with the reflective layer 27 shown in FIG. 1 is attached to the connecting layer 12 shown in FIG. 2, and the growth substrate 21 is removed (not shown) as shown in FIG. 3. The material of the connecting layer 12 can be metal, for example, AuSn, InAg, InAu, In, Au, Al, Ag, or the alloys thereof.

The electrodes 13 and 14 are formed respectively on the first conductivity type semiconductor layer 23 and under the electrically conductive substrate 11 as shown in FIG. 4. A transparent paste layer 15 with a thickness no less than 0.3 mm covers the first conductivity type semiconductor layer 23 except the portion of the upper electrode. The material of the transparent paste layer 15 can be epoxy, and the coating area of the transparent paste layer 15 is not greater than that of the epitaxial structure 22. A reflective wall 17 is formed on a sidewall of the transparent paste layer 15, and a wavelength conversion structure 16 covers the whole upper surface of the transparent paste layer 15, wherein the wavelength conversion structure 16 is made of at least one wavelength conversion material. The semiconductor luminescence device 100 shown in FIG. 5 is then formed accordingly.

The epitaxial structure 22 can emit a first light when the current is injected. The light extraction efficiency is not decreased much after the first light passes through the transparent paste layer 15 because the optical transmission of the transparent paste layer is close to 99-100% and the light from the sidewall is reflected by the reflective wall 17. The first light entering the wavelength conversion structure 16 can be absorbed by the wavelength conversion material in the wavelength conversion structure 16, and the wavelength conversion structure 16 can generate a second light having a wavelength different from that of the first light. Because the wavelength conversion material is not limited to one kind, the second light can include many hues.

In this embodiment, the wavelength conversion material is phosphor, for example, $Y_3Al_5O_{12}$. Besides, the wavelength conversion material can also be $Gd_3Ga_5O_{12}$:Ce, $(Lu_5Y)_3Al_5O_{12}$:Ce, SrS:Eu, SrGa$_2$S$_4$:Eu, (Sr, Ca,Ba)(Al,Ga)$_2$S$_4$:Eu, (Ca,Sr)S:Eu,Mn, (Ca,Sr)S:Ce, (Sr,Ba, Ca)$_2$Si$_5$N$_8$:Eu, (Ba,Sr, Ca)$_2$SiO$_4$:Eu, (Ca,Sr,Ba)Si$_2$O$_2$N$_2$:Eu, and an non-electrically-insulative material like CdZnSe is preferred.

Figure 6:
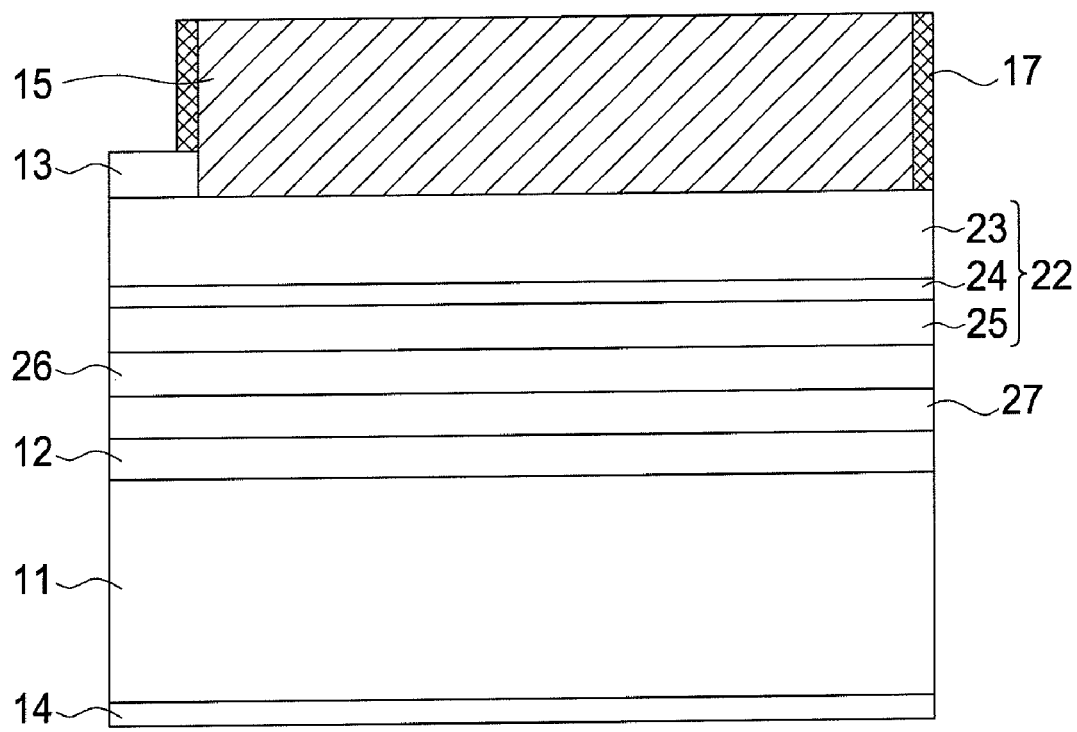
FIG. 6 illustrates a sectional view of forming a semiconductor luminescence device 200 in accordance with another embodiment of the present application.

FIG. 6 illustrates a sectional view of forming a semiconductor luminescence device 200 in accordance with another embodiment of the present application. The preceding manufacturing processes are the same as that of the above embodiment shown in FIG. 1 to FIG. 4. A transparent paste layer 15 with a thickness no less than 0.3 mm covers the first conductivity type semiconductor layer 23 except the portion of the upper electrode, and the transparent paste layer 15 contains the wavelength conversion material distributed uniformly therein. The material of the transparent paste layer 15 can be epoxy, and the coating area of the transparent paste layer 15 is not greater than that of the epitaxial structure 22. A reflective wall 17 is formed on the sidewall of the transparent paste layer 15. The semiconductor luminescence device 200 shown in FIG. 6 is then formed accordingly. The epitaxial structure 22 can emit a first light when the current is injected. The first light entering the transparent paste layer 15 can be absorbed by the wavelength conversion material dispersed in the transparent paste layer 15, and the wavelength conversion material can generate a second light which is different from the first light. Because the wavelength conversion material is not limited to one kind, the second light can include many hues.

Figure 7:
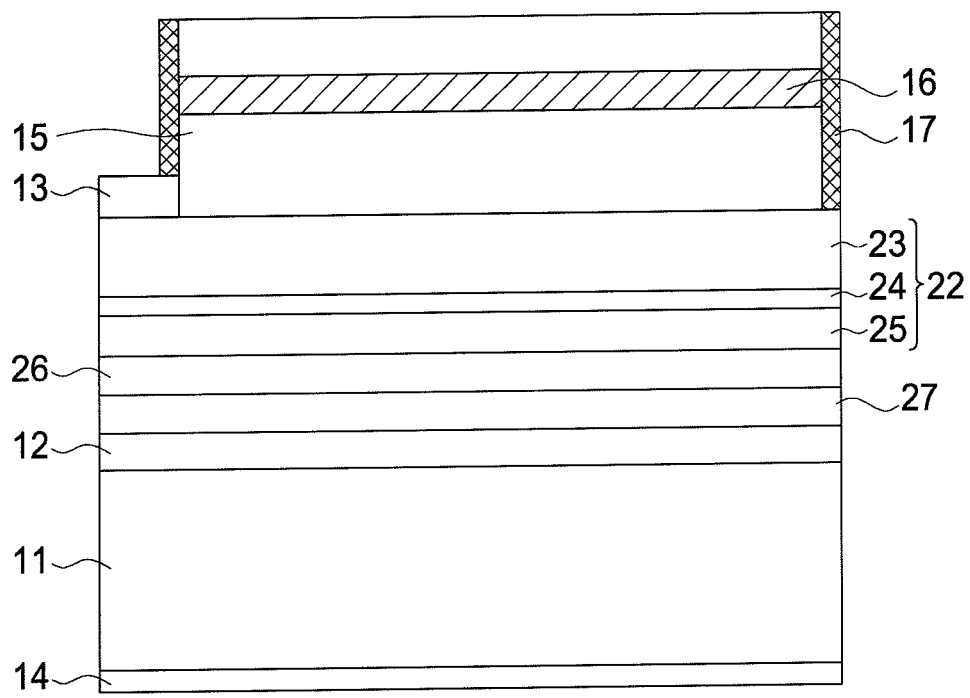
FIG. 7 illustrates a sectional view of forming a semiconductor luminescence device 300 in accordance with another embodiment of the present application.

FIG. 7 illustrates a sectional view of forming a semiconductor luminescence device 300 in accordance with another embodiment of the present application. The preceding manufacturing processes are the same as that of the above embodiment, as the FIG. 1 to FIG. 4 shown. A transparent paste layer 15 with a thickness no less than 0.3 mm covers the first conductivity type semiconductor layer 23 except the portion of the upper electrode. The material of the transparent paste layer 15 can be epoxy, and the coating area of the transparent paste layer 15 is not greater than that of the epitaxial structure 22. A reflective wall 17 is formed on the sidewall of the transparent paste layer 15, and a wavelength conversion structure 16 is formed in the transparent paste layer 15, wherein the wavelength conversion structure 16 contains at least one kind of wavelength conversion material. The semiconductor luminescence device 300 shown in FIG. 7 is then formed accordingly. The epitaxial structure 22 can emit a first light when the current is injected. The light extraction efficiency is not decreased much after the first light passes through the transparent paste layer 15 because the optical transmission of the transparent paste layer is close to 99-100% and the light from the sidewall is reflected by the reflective wall 17. The first light entering the wavelength conversion structure 16 can be absorbed by the wavelength conversion material in the wavelength conversion structure 16 and the wavelength conversion structure 16 can generate a second light having a wavelength different from that of the first light. Because the wavelength conversion material is not limited to one kind, the second light can include many hues. Finally, the light emits through the transparent paste layer 15.

Figure 8A:
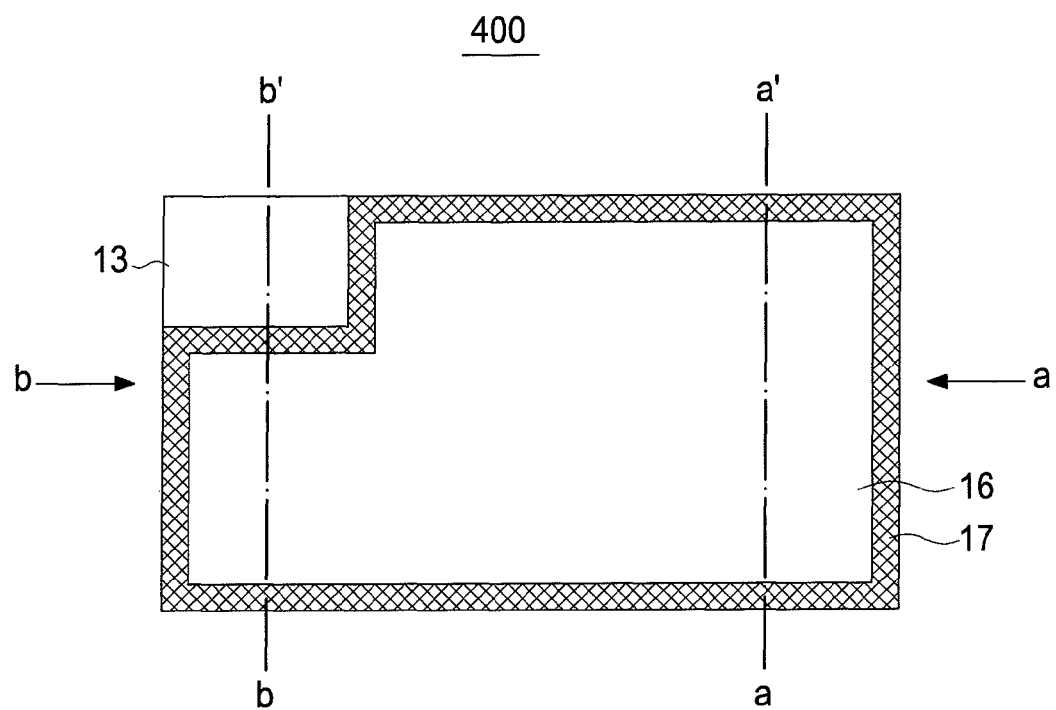
FIGS. 8A-8C illustrate the sectional views of forming a semiconductor luminescence device 400 in accordance with another embodiment of the present application.
Figure 8B:
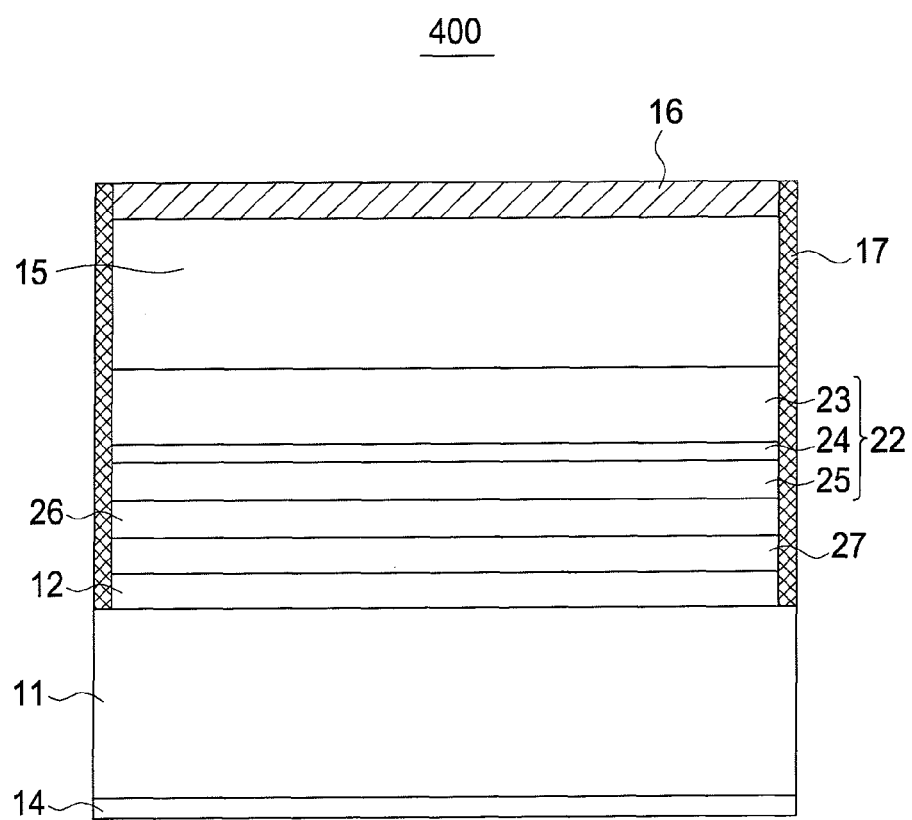
Figure 8C:
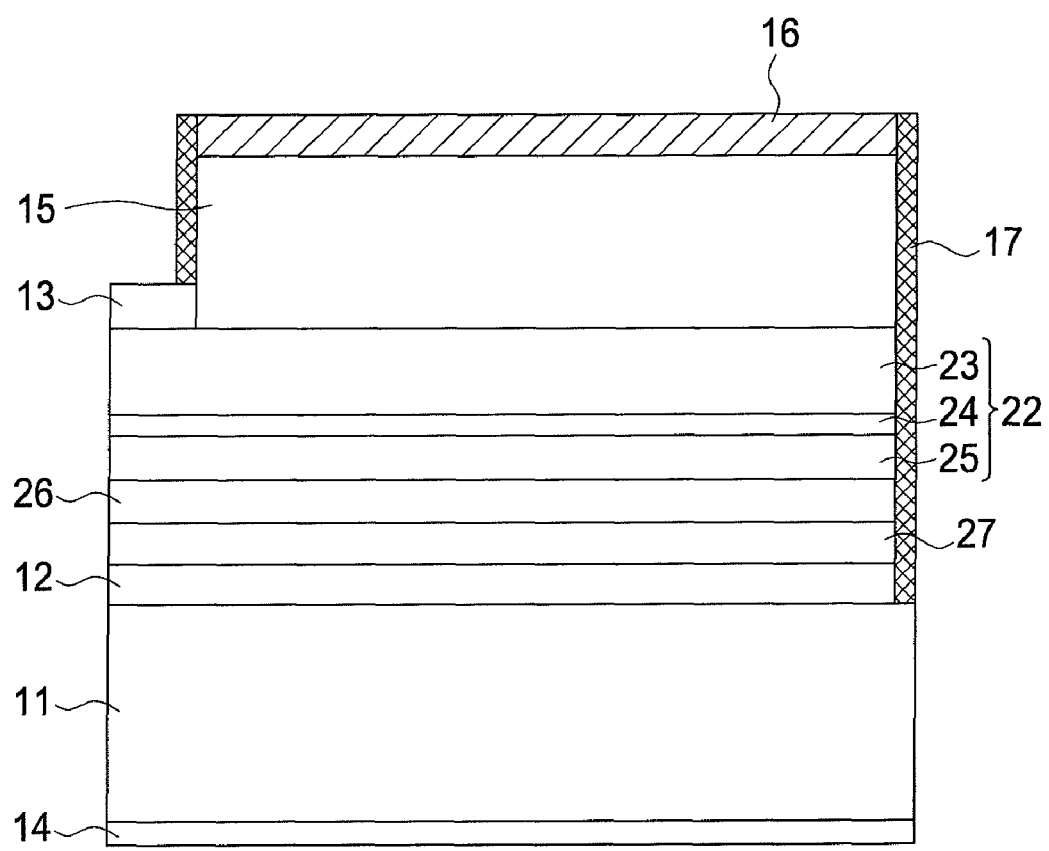

FIG. 8A illustrates a top view of forming a semiconductor luminescence device 400. FIG. 8B illustrates a cross-sectional view along the a' a' dotted line of FIG. 8A. FIG. 8C illustrates a cross-sectional view along the b' b' dotted line of FIG. 8A. The preceding manufacturing processes are the same as that of the above embodiment shown in FIG. 1 to FIG. 3. When the growth substrate 21 is removed (not shown in the figure), a portion of the first conductivity type semiconductor layer 23, the active layer 24, the second conductivity type semiconductor layer 25, the second conductivity type contact layer 26, the reflective layer 27, and the connecting layer 12 are etched away to expose the upper surface of the electrically conductive substrate 11. The electrodes 13 and 14 are formed respectively on the first conductivity type semiconductor layer 23 and under the electrically conductive substrate 11. Specifically, the electrode 13 can be formed in a corner of a top surface of the first conductivity type semiconductor layer 23, as shown in FIG. 8A. A transparent paste layer 15 with a thickness no less than 0.3 mm covers the first conductivity type semiconductor layer 23 except the portion of the upper electrode, that is the corner of the top surface of the first conductivity type semiconductor layer 23 where the electrode 13 is formed is not covered by the transparent paste layer 15. Moreover, the transparent paste layer 15 does not cover a sidewall of the epitaxial structure 22. The material of the transparent paste layer 15 can be epoxy, and the coating area of the transparent paste layer 15 is not greater than that of the epitaxial structure 22. A reflective wall 17 is formed on the sidewall of the transparent paste layer 15, and a wavelength conversion structure 16 covers the whole upper surface of the transparent paste layer 15 wherein the wavelength conversion structure 16 contains at least one kind of wavelength conversion material. Since the transparent paste layer 15 does not cover the corner, the wavelength conversion structure 16 can be arranged not to cover the corner either. In addition, the electrode 13 can have adjacent side surfaces devoid of the wavelength conversion structure 16, and the epitaxial structure 22 can also have a sidewall devoid of the wavelength conversion structure 16. To avoid the light loss from the light-emitting diode sideway, a reflective wall 17 is formed on the sidewalls of the transparent paste layer 15, the first conductivity type semiconductor layer 23, the active layer 24, the second conductivity type semiconductor layer 25, the second conductivity type contact layer 26, the reflective layer 27, and the connecting layer 12. The semiconductor luminescence device 400 shown in FIG. 8C is then formed accordingly. The epitaxial structure 22 can emit a first light when the current is injected. The light extraction efficiency is not decreased much after the first light passes through the transparent paste layer 15 because the optical transmission of the transparent paste layer is close to 99-100% and the light from the sidewall is reflected by the reflective wall 17. The first light entering the wavelength conversion structure 16 can be absorbed by the wavelength conversion material in the wavelength conversion structure 16 and the wavelength conversion structure 16 can generate a second light having a wavelength different from that of the first light. Because the wavelength conversion material is not limited to one kind, the second light can include many hues.

Figure 9:
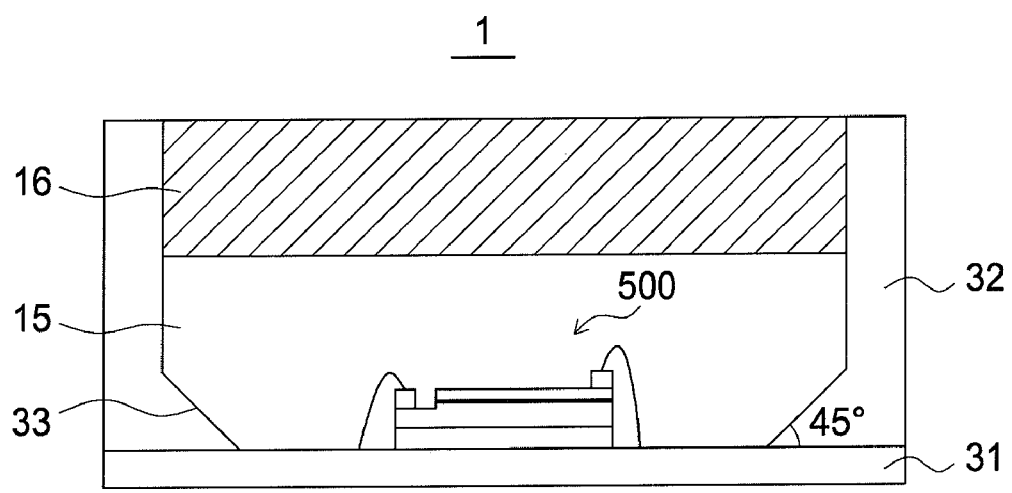
FIG. 9 illustrates a sectional view of forming a semiconductor luminescence device package structure 1 in accordance with one embodiment of the present application.

The same design concept can be applied to the semiconductor luminescence device package structure 1 as shown in FIG. 9. A semiconductor luminescence device 500 is fixed on the lead frame 31 and is electrically connected to the circuit of the lead frame 31 by an electrical connector. A cup 32 with a reflective wall 33 is on the lead frame 31, and the angle between at least a portion of the reflective wall 33 and the lead frame 31 is about 45 degree. The cup 32 is filled with the transparent paste layer 15, and the height of the transparent paste layer 15 is at least greater than that of the semiconductor luminescence device 500. The transparent paste layer 15 can be made of a transparent material, such as epoxy. A wavelength conversion structure 16 is formed on the transparent paste layer 15, and the semiconductor luminescence device package structure 1 is formed. The semiconductor luminescence device 500 can emit a first light when the current is injected. The light extraction efficiency is not decreased much after the first light passes through the transparent paste layer 15 because the optical transmission of the transparent paste layer is close to 99-100%. The first light entering the wavelength conversion structure 16 can be absorbed by the wavelength conversion material in the wavelength conversion structure, and the wavelength conversion structure 16 can generate a second light having a wavelength different from that of the first light. Because the wavelength conversion material is not limited to one kind, the second light can include many hues.

Figure 10:
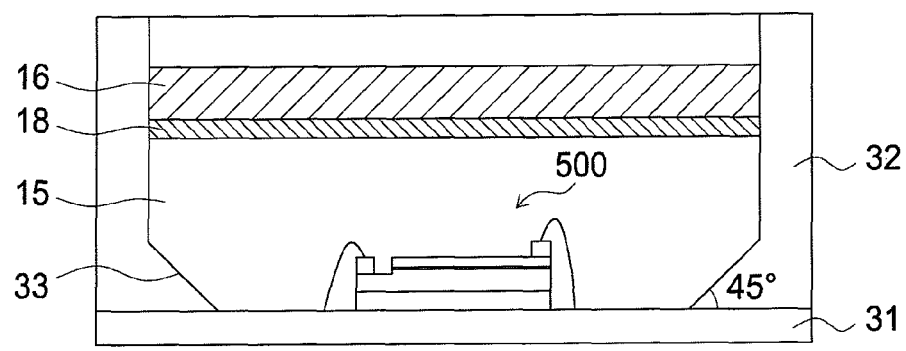
FIG. 10 illustrates a sectional view of forming a semiconductor luminescence device package structure 2 in accordance with another embodiment of the present application.

FIG. 10 illustrates a cross-sectional view of forming a semiconductor luminescence device package structure 2. Most of the manufacturing processes are similar to the semiconductor luminescence device package structure 1. A semiconductor luminescence device 500 is fixed on the lead frame 31 and is electrically connected to the circuit of the lead frame 31 by an electrical connector. A cup 32 with a reflective wall 33 is on the lead frame 31, and the angle between at least a portion of the reflective wall 33 and the lead frame 31 is about 45 degree. The cup 32 is filled with the transparent paste layer 15, and the height of the transparent paste layer 15 is at least greater than that of the semiconductor luminescence device 500. The transparent paste layer 15 can be made of a transparent material, such as epoxy. A wavelength conversion structure 16 is formed in the transparent paste layer 15. In this embodiment, a wavelength selection film 18 is further formed between the transparent paste layer 15 and the wavelength conversion structure 16. The wavelength selection film 18 allows the visible light to pass through to head to the wavelength conversion structure 16 and bans the visible light that is reflected by the wavelength conversion structure 16.

Figure 11:
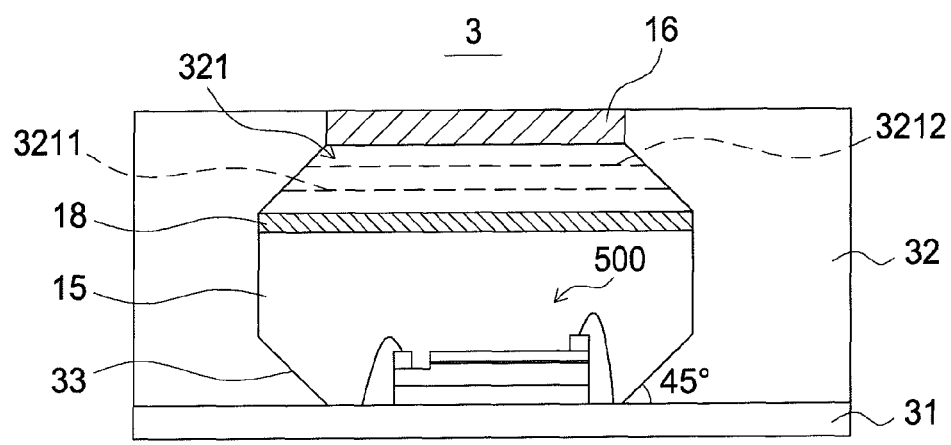
FIG. 11 illustrates a sectional view of forming a semiconductor luminescence device package structure 3 in accordance with another embodiment of the present application.

FIG. 11 illustrates a cross-sectional view of a semiconductor luminescence device package structure 3 in accordance with an embodiment of the present application. The design of the reflective wall 33 on the sidewall of the cup is shown in FIG. 11 and has improved reflective effect than that of the device shown in the FIG. 10. A semiconductor luminescence device 500 is fixed on the lead frame 31 and is electrically connected to the circuit of the lead frame 31 by an electrical connector. A cup 32 with a reflective wall 33 is on the lead frame 31, and the angle between at least a portion of the reflective wall 33 and the lead frame 31 is about 45 degree. Specifically, the cup 32 has a space 321 inside. The Space 321 has an open boundary and a close boundary. The open boundary is defined or confined by the wavelength conversion structure 16 and can be functioned as an exit through which the light from the semiconductor luminescence device 500 can escape from the cup 32 or the space 321. The close boundary can be defined or confined by the reflective wall 33 and the lead frame 31. In other words, the reflective wall 33 can be functioned as a reflective boundary which can reflect light; while the lead frame 31 can be functioned as a non-reflective boundary which can absorb light or has a reflectivity less than that of the reflective wall 33. The space 321 at least has a first cross section 3211 and a second cross section 3212. In one embodiment, the first cross section 3211 is substantially parallel to the wavelength conversion structure 16 and has a first area greater than a top area of the wavelength conversion structure 16. The second cross section 3212 is arranged between the first cross section 3211 and the wavelength structure 16, and has a second area between the top area and the first area. Furthermore, the space 321 can be filled with the transparent paste layer 15. The transparent paste layer 15 can be made of a transparent material, such as epoxy. A wavelength conversion structure 16 is formed on the transparent paste layer 15, that is, disposed over the space 321. The semiconductor luminescence device 500 is also arranged in the space 321 to be distant from the top area of the wavelength conversion structure 16 and close to the first cross section 3211. Specifically, a shortest distance between the semiconductor luminescence device 500 and the first cross section 3211 is less than that between the semiconductor luminescence device 500 and the wavelength conversion structure 16. The height of the transparent paste layer 15 is at least greater than that of the semiconductor luminescence device 500, as the description of FIG. 9. A wavelength selection film 18 is further arranged in the space 321 and between the wavelength conversion structure 16 and the semiconductor luminescence device 500. The wavelength selection film 18 has an area larger than that of the wavelength conversion structure 16, as shown in FIG. 11. In another embodiment, the reflective wall 33 can surround the transparent paste layer 15. The semiconductor luminescence device 500 can emit a first light when current is injected. The light extraction efficiency is not decreased much after the first light passes through the transparent paste layer 15 because the optical transmission of the transparent paste layer 15 is close to 99-100%. The first light entering the wavelength conversion structure 16 can be absorbed by the wavelength conversion material in the wavelength conversion structure 16, and the wavelength conversion structure 16 can generate a second light having a wavelength different from that of the first light. Because the wavelength conversion material is not limited to one kind, the second light can include many hues.

Other embodiments of the application will be apparent to those having ordinary skills in the art from consideration of the specification and practice of the invention disclosed herein. It is intended that the specification and examples be considered as exemplary only, with a true scope and spirit of the invention being indicated by the following claims.

I claim:

1. A light-emitting device, comprising:
    a transparent layer having an upper surface, a lower surface, and a sidewall;
    a wavelength conversion structure arranged on the upper surface;
    an epitaxial structure arranged on the lower surface and having a side surface devoid of the transparent layer and the wavelength conversion structure; and
    a reflective wall arranged to cover the sidewall.

2. The light-emitting device of claim 1, further comprising an electrode contacting with the transparent layer.

3. The light-emitting device of claim 1, further comprising an electrode contacting with the reflective wall.

4. The light-emitting device of claim 1, wherein the reflective wall is configured to surround the transparent layer.

5. The light-emitting device of claim 1, wherein the reflective wall is configured to cover the wavelength conversion structure.

6. The light-emitting device of claim 1, wherein the reflective wall is configured to cover the epitaxial structure.

7. The light-emitting device of claim 1, wherein the transparent layer has a thickness of at least 0.3 mm.

8. A light-emitting device, comprising:
    a wavelength conversion structure having a side surface;
    an epitaxial structure under the wavelength conversion structure, and having a bottom surface and a top surface with a corner substantially devoid of the wavelength conversion structure; and
    a first electrode arranged in the corner and having adjacent side surfaces devoid of the wavelength conversion structure.

9. The light-emitting device of claim 8, further comprising a second electrode arranged on the bottom surface.

10. The light-emitting device of claim 8, further comprising a transparent layer between the wavelength conversion structure and the epitaxial structure.

11. The light-emitting device of claim 10, further comprising a reflective wall covering the side surface and the transparent layer.

12. The light-emitting device of claim 8, further comprising a reflective wall covering the side surface.

13. The light-emitting device of claim 8, wherein the wavelength conversion structure is distant from the epitaxial structure by a distance of at least 0.3 mm.

14. A light-emitting device, comprising:
    a wavelength conversion structure having a top area;
    a space having a reflective boundary, and a first cross section that is substantially parallel to the wavelength conversion structure and has a first area greater than the top area; and
    a semiconductor luminescence device arranged in the space to be distant from the top area and close to the first cross section.

15. The light-emitting device of claim 14, further comprising a wavelength selection film arranged in the space, and between the wavelength conversion structure and the semiconductor luminescence device.

16. The light-emitting device of claim 14, further comprising a transparent layer in the space.

17. The light-emitting device of claim 16, wherein the reflective boundary surrounds the transparent layer.

18. The light-emitting device of claim 16, wherein the transparent layer has a height greater than the semiconductor luminescence device.

19. The light-emitting device of claim 14, wherein the wavelength conversion structure is disposed over the space.

20. The light-emitting device of claim 14, wherein the space has a second cross section arranged between the first cross section and the wavelength conversion structure, and having a second area between the top area and the first area.

* * * * *